US009604431B2

United States Patent
Sakatani et al.

(10) Patent No.: US 9,604,431 B2
(45) Date of Patent: Mar. 28, 2017

(54) COMPOSITE SHEET, MOUNTING STRUCTURE INCLUDING THE COMPOSITE SHEET AND ELECTRONIC APPARATUS INCLUDING THE MOUNTING STRUCTURE

(71) Applicant: Panasonic Corporation, Osaka (JP)

(72) Inventors: Shigeaki Sakatani, Osaka (JP);
Kazuma Oikawa, Osaka (JP); Kentaro Takada, Osaka (JP); Yoichi Hisatake, Osaka (JP); Daido Kohmyohji, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/476,742

(22) Filed: Sep. 4, 2014

(65) Prior Publication Data

US 2015/0077957 A1 Mar. 19, 2015

(30) Foreign Application Priority Data

Sep. 17, 2013 (JP) .................................. 2013-191421
Jul. 3, 2014 (JP) .................................. 2014-137831

(51) Int. Cl.
| | |
|---|---|
| *H05K 1/02* | (2006.01) |
| *B32B 9/04* | (2006.01) |
| *B32B 5/18* | (2006.01) |
| *H01L 23/36* | (2006.01) |
| *H01L 23/373* | (2006.01) |
| *B32B 7/12* | (2006.01) |
| *B32B 9/00* | (2006.01) |

(Continued)

(52) U.S. Cl.
CPC ............... *B32B 9/046* (2013.01); *B32B 5/18* (2013.01); *B32B 7/12* (2013.01); *B32B 9/007* (2013.01); *B32B 25/02* (2013.01); *B32B 25/045* (2013.01); *H01L 23/36* (2013.01); *H01L 23/373* (2013.01); *B32B 2307/302* (2013.01); *B32B 2307/304* (2013.01); *B32B 2457/00* (2013.01); *H01L 2924/0002* (2013.01); *Y10T 428/233* (2015.01); *Y10T 428/249982* (2015.04)

(58) Field of Classification Search
CPC B32B 9/046; B32B 5/18; B32B 9/007; B32B 7/12; B32B 25/02; B32B 25/045
USPC ................ 174/259, 250, 252, 255, 256, 258
See application file for complete search history.

(56) References Cited

U.S. PATENT DOCUMENTS

| | | | | |
|---|---|---|---|---|
| 2004/0076810 | A1* | 4/2004 | Blain | ........................ B32B 9/00 428/293.4 |
| 2004/0240144 | A1* | 12/2004 | Schott | .................... B82Y 10/00 361/302 |

(Continued)

FOREIGN PATENT DOCUMENTS

JP 2009-111003 5/2009

Primary Examiner — Tremesha S Willis
(74) Attorney, Agent, or Firm — Panasonic IP Management; Kerry S. Culpepper

(57) ABSTRACT

A composite sheet includes: a graphite layer that is disposed on a high temperature portion; an aerogel layer that is disposed on a low temperature portion; and an adhesive layer to which the graphite layer and the aerogel layer are fixed, in which the adhesive layer is formed of a water-based adhesive. The water-based adhesive layer is formed of an adhesive containing water as a solvent or an adhesive containing water as a raw material. The water-based adhesive layer includes gaps.

21 Claims, 6 Drawing Sheets

(51) Int. Cl.
*B32B 25/02* (2006.01)
*B32B 25/04* (2006.01)

(56) References Cited

U.S. PATENT DOCUMENTS

| | | | | |
|---|---|---|---|---|
| 2005/0270746 A1* | 12/2005 | Reis | ......................... | G06F 1/203 |
| | | | | 361/708 |
| 2013/0171417 A1* | 7/2013 | Zou | ........................... | B32B 7/12 |
| | | | | 428/166 |
| 2013/0274376 A1* | 10/2013 | Moorlag | .............. | C09D 127/12 |
| | | | | 523/218 |

\* cited by examiner

COMPOSITE SHEET, MOUNTING STRUCTURE INCLUDING THE COMPOSITE SHEET AND ELECTRONIC APPARATUS INCLUDING THE MOUNTING STRUCTURE

BACKGROUND

Technical Field

The technical field relates to a member for dissipating heat of an electronic component. In particular, the technical field relates to a member for dissipating heat of an electronic component (heat-generating component) that generates heat in a housing of an electronic apparatus, a precision apparatus, or the like.

Description of Related Art

Recently, along with an improvement of performance of electronic apparatuses such as mobile phones or laptops, the heat generation density of a heat-generating component has rapidly increased. For electronic apparatuses, thermal diffusion members have been required. In particular, there are many occurrences in which small mobile apparatuses come into direct contact with the human body. Therefore, an increase in the outer surface temperature of a housing of such a small mobile apparatus causes problems.

One of the problems caused by the increase in the outer surface temperature of a housing of a mobile apparatus is a low-temperature burn. The low-temperature burn is a burn caused when the human body is exposed to a temperature higher than the body temperature for a long period of time. The human body is burned when exposed to a temperature of 44° C. for 6 hours. A report shows that, as the temperature increases by 1° C., the time taken for the human body to be burned is reduced to half.

Unlike common burns, in the case of the low-temperature burn, the patient recognizes the progress of the symptom late in most cases. When the patient recognizes the progress of the symptom, the skin is severely burned in many cases. Recently, many medical cases have been reported in which, when a small laptop is used on the lap for a long period of time, a low-temperature burn is caused. In the future, since small and mobile apparatuses will be increasingly developed, the most important issue is to suppress the surface temperature of an apparatus to a low temperature by even 1° C.

As a method of preventing an increase in the surface temperature of an apparatus, JP-A-2009-111003 discloses a configuration of providing a sheet, in which a graphite sheet and a heat insulating material are laminated, between a heat-generating component and a housing. FIG. 6 illustrates a composite sheet 50 having this configuration.

A component 11 is mounted on a substrate 10. A thermally conductive layer 12 and a heat insulating layer 13 are laminated on the component 11, and a housing 14 is positioned thereon.

Heat generated in the component is diffused in the thermally conductive layer 12. The heat diffusion stops in the heat insulating layer 13. As a result, the heat is not locally conducted to the housing 14.

Accordingly, when the housing 14 is touched by a hand, local heat is not detected.

SUMMARY OF THE INVENTION

However, in the above-described, structure disclosed in JP-A-2009-111003, heat insulating materials of inorganic fiber glass wool or rock wool and natural wool, heat insulating materials of cellulose, and the like are used as the composite sheet.

However, with such a composite sheet, sufficient heat insulating performance cannot be obtained. In particular, along with a reduction in the size of an apparatus, the thickness of a heat insulating material is also reduced. As a result, the heat insulating performance of the composite sheet is decreased. Therefore, heat is concentrated on the housing.

Accordingly, a concern of the present disclosure is to provide a thin composite sheet having superior heat insulating performance.

In order to solve the above-described problems, according to an aspect there is provided a composite sheet including: a graphite layer that is disposed on a high temperature portion; an aerogel layer that is disposed on a low temperature portion; and an adhesive layer to which the graphite layer and the aerogel layer are fixed, in which the adhesive layer is formed of an adhesive containing water as a dispersant, an adhesive containing water as a solvent, or an adhesive containing water.

In addition, according to another aspect, there is provided a composite sheet including: a graphite layer that is disposed on a side of an electronic component; an aerogel layer that is disposed on a side of a housing; and an adhesive layer to which the graphite layer and the aerogel layer are fixed, in which an area of the aerogel layer is less than an area of the graphite layer, and the aerogel layer is positioned at a position corresponding to the electronic component.

Accordingly, in the composite sheet a heat insulating effect can be sufficiently exhibited even in a narrow space inside a housing of an electronic apparatus. In addition, heat conduction from a heat-generating component to a housing can be efficiently reduced. The composite sheet can be incorporated into an electronic apparatus.

DESCRIPTION OF EMBODIMENTS

Embodiment 1

Figure 1A:
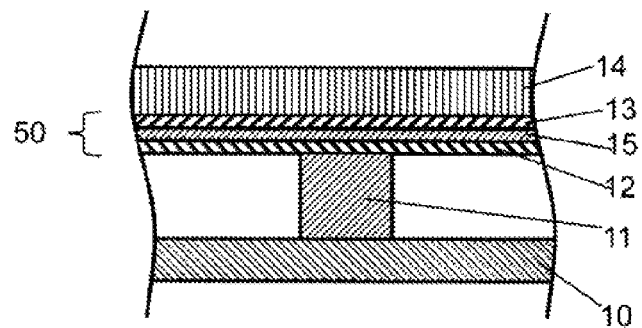
FIG. 1A is a cross-sectional view illustrating a heat insulating structure according to Embodiment 1.
Figure 1B:
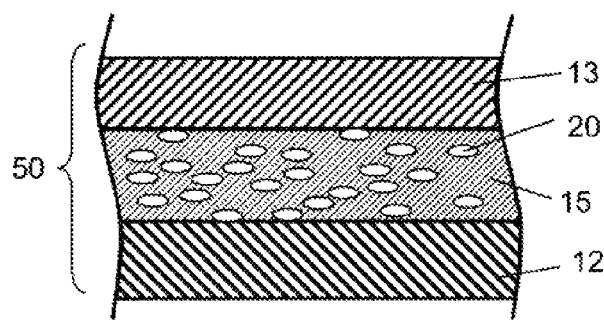
FIG. 1B is a partially enlarged view of FIG. 1A.
Figure 1C:
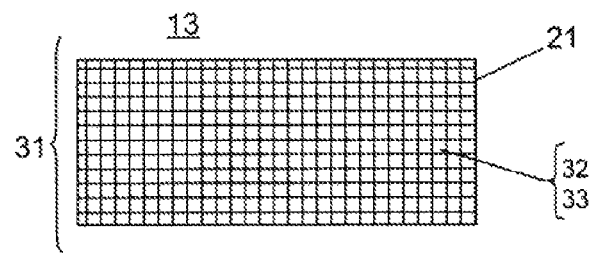
FIG. 1C is a partially enlarged cross-sectional view illustrating a heat insulator.

FIG. 1A is a cross-sectional view illustrating an internal structure of an electronic apparatus including a composite sheet 50 according to Embodiment 1. FIG. 1B is an enlarged cross-sectional view illustrating an adhesive layer 15 of the composite sheet 50 according to Embodiment 1. FIG. 1C is an enlarged cross-sectional view illustrating a heat insulating layer 13, The electronic apparatus includes a housing 14, the composite sheet 50, a component 11, and a substrate 10. The composite sheet 50 includes the heat insulating layer 13, the adhesive layer 15, and a thermally conductive layer 12. Other members which are not described have the same configurations as those of members of the related art. It is preferable that gaps 20 be present in the adhesive layer 15. The details will be described below.

The composite sheet 50 serves to diffuse heat generated from the component 11 (high temperature portion) over the thermally conductive layer 12 in a horizontal direction. Then, due to the heat insulating layer 13, the heat is not conducted to housing 14 (low-temperature portion).

In FIG. 1C, in the heat insulating layer 13, nanofibers 32 and aerogel 33 are mixed and held between fibers 21 inside the fiber sheet 31. In this case, the fibers 21 are not necessarily provided in the heat insulating layer 13. When the fibers 21 are present in the heat insulating layer 13, a shape of the heat insulating layer 13 is easily maintained. The nanofibers 32 are not required. However, when the nanofibers 32 are present in the heat insulating layer 13, powder of the aerogel 33 is not easily separated therefrom.

It is preferable that the adhesive layer 15 is present between the housing 14 and the heat insulating layer 13. Through the adhesive layer 15, the heat insulating layer 13 can be reliably fixed to the housing 14. The adhesive layer 15 can prevent the heat insulating layer 13 from being, for example, cracked or damaged.

Thermally Conductive Layer 12

As the thermally conductive layer 12, a metal plate or the like may be used. However, a graphite sheet or a rubber sheet including graphite and rubber is preferably used. That is, a graphite layer is preferably used. This sheet has high thermal conductivity in the horizontal direction and thus can diffuse heat. In addition, a ratio of the thermal conductivity in the horizontal direction to the thermal conductivity in the vertical direction is high. As a result, heat is diffused mainly in the horizontal direction.

The graphite sheet is prepared using, for example, the following method. A polymeric film having a thickness of 50 μm or less is pressurized at a high temperature of higher than 2500° C. and treated in a reducing atmosphere to prepare the graphite sheet. The graphite sheet has a composition in which the carbon content is substantially 100%. Therefore, this graphite sheet is a graphite plate that is laminated parallel to a basal surface which is a surface forming a. 6-membered ring of carbon. The thickness of the graphite sheet is about 0.1 mm.

In addition, a front surface and a back surface of the graphite sheet are substantially parallel to the surface (basal surface) forming a 6-membered ring of carbon. The thermal conductivity of the graphite sheet in this parallel direction is 1000 W/mk or higher, the thermal conductivity of the graphite sheet in the perpendicular direction is 5 W/mk or lower, the specific gravity thereof is 2.25 g/cm$^3$ or less, and the conductivity and the Young's modulus thereof are 10$^3$ S/m or higher and 750 GPa or more, respectively.

Method of Producing Graphite

As a starting material, an aromatic polyimide sheet material having a thickness of 25 μm to 75 μm is prepared. First, 1 kg of the sheet material is weighed to fill the inside of a carbon crucible. Next, the crucible filled with the sheet material is put into an electric furnace for heating, and the inside atmosphere of the electric furnace is substituted with nitrogen gas. After the nitrogen gas substitution, the electric furnace is heated at a temperature increase rate of 100° C./h, is held at the maximum temperature for 1 hour, and is naturally cooled to room, temperature. During heating, nitrogen gas is allowed to flow.

Here, the maximum temperature during heating is 1500° C. to 2500° C.

Examples of such a polymeric material include aromatic polyimide, polyamide imide, polyamide, polyoxadiazole, and polybenzimidazole.

Among these, aromatic polyimide is preferably used as the polymeric material. The thermal conductivity of graphite produced from aromatic polyimide is higher than those of the other materials.

In addition to the graphite sheet, a graphite-containing rubber sheet may also be used. The graphite-containing rubber sheet contains a resin having a rubber component in addition to carbon. As the graphite, powder of the graphite sheet is used. In order to obtain this powder, about 40 wt % of graphite filler, about 60 wt % of EPDM (ESPRENE, manufactured by Sumitomo Chemical Co., Ltd.), a peroxide crosslinking agent, and steraric acid are mixed with each other, followed by sufficient kneading with a 8-inch two-roll kneader to prepare a mixture. At this time, graphite filler powder in the mixture is aligned in a plane direction. Further, the mixture is heated at 170° C. for 10 minutes to be vulcanized. The obtained powder is thermally conductive and has high thermal conductivity in a planar direction.

Heat Insulating Layer 13

As the heat insulating layer 13, aerogel containing fibers is preferably used. That is, it is preferable that the heat insulating layer 13 be an aerogel layer. The thermal conductivity of the aerogel is lower than 0.028 W/mK which is the thermal conductivity of air and is substantially in a range of 0.013 W/mK to 0.025 W/mK.

This aerogel 33 is a foam product containing about 85 vol % to 95 vol % of air. Since the pore size of the foam product is less than 68 nm which is the mean free path of air, low thermal conductivity is achieved.

In addition, the aerogel 33 is a foam product in which the amount of silica as a solid content is extremely small. Therefore, the skeleton of the aerogel 33 is brittle, and once the skeleton is broken, the volume thereof is significantly decreased.

This heat insulating layer 13 includes: the fiber sheet 31 that is a substrate; and the aerogel 33 that contains the nanofibers 32.

Composition

It is preferable that a ratio of the volume of the aerogel 33 (silica xerogel or silica aerogel) containing the nanofibers 32 to the volume of an air layer in the fiber sheet 31 be 50% to 98%. The volume ratio is more preferably 80% to 98% and particularly preferably 90% to 98%.

In this state, operability is superior, and the composite sheet 50 having superior heat insulating performance can be obtained. When the volume ratio is less than 50%, convection cannot be sufficiently suppressed, and the thermal conductivity may be increased. On the other hand, when the volume ratio is more than 98%, the flexibility of a fibrous composite sheet is insufficient and the operability is decreased.

Fiber Sheet 31

The fiber sheet 31 as the substrate only needs to be formed of, for example, glass wool or rock wool, resin fibers such as polyester, or composite fibers containing plural kinds of the above-described materials. The fibers to be used are selected in consideration of the heat-resistant temperature and the incombustibility of the composite sheet during use. However, since cellulose and pulp fibers are degraded in a process in which an acid is used during hydrophobizing, it is necessary that the fibers be hydrophobized with alkoxysilane or hexamethyldisilazane.

In order to convert the aerogel 33 in the sol state into the fiber sheet 31 as a composite material thereof, in the fiber sheet 31 formed of glass wool or cellulose fibers which have a high affinity with sol, the wettability is superior. As a result, the fiber sheet 31 and xerogel are easily converted into a composite material.

Nanofibers 32

The nanofibers 32 have hydroxyl groups on surfaces of cellulose nanofibers, silica nanofibers, or the like. The fiber diameter of the nanofibers 32 is 30 nm or less.

A ratio of fine particles having a particle size of 0.1 μm to 10 μm to all the fine particles desorbed from, the aerogel 33 is 7 to 9.5 (the average particle size is 0.1 μm to 10 μm). By using the nanofibers 32 having a fiber diameter of 30 nm or less (having an average fiber diameter of 30 nm or less), the desorption of fine particles having a particle size of 0.1 μm or more is easily suppressed when a three-dimensional network of the nanofibers 32 is formed.

By controlling the fiber diameter of the nanofibers 32 to be 30 nm or less and controlling the nanofiber content to be 1 wt % to 10 wt % with respect to the volume of the aerogel 33, when the nanofibers 32 are mixed with the aerogel 33 to obtain a composite material, the gap size of the nanofibers 32 is about 5 nm to 70 nm.

Accordingly, it is considered that fine particles of the aerogel 33 having a particle size of 0.1 μm or more is not easily desorbed from gaps of the nanofibers 32. The reason is as follows. That is, the secondary particle size of the aerogel 33 is 20 nm to 30 nm. A continuous structure of the particles uniformly forms a three-dimensional structure. With the above-described configuration, pores having a size of 5 nm to 67 nm are formed.

In addition, it is preferable that the fiber diameter is 5 nm to 100 nm.

When the fiber diameter is less than 5 nm, the desorption of fine particles of the aerogel 33 can be prevented.

When the fiber diameter is more than 100 nm, there is a large effect on thermal conductivity.

When the fiber diameter is 5 nm to 50 nm, the desorption of the aerogel 33 can be prevented, and there is a small effect on thermal conductivity. It is more preferable that the fiber diameter be 5 nm to 30 nm because the desorption of the aerogel 33 can be prevented and there is substantially no effect on thermal conductivity.

In addition, in Embodiment 1, particularly, by using the following nanofibers 32 having a particle size of 30 nm or less, an effect of minimizing the thermal conductivity of the nanofibers 32 and suppressing an increase in the thermal conductivity of the composite sheet 50 is also obtained.

When 1 wt % to 10 wt % of the nanofibers 32 are added, a solid thermal conduction component of the commonly-used fiber sheet 31 has a thermal conductivity of about 0.001 W/mK to 0.003 W/mK. Therefore, the thermal conductivity of the composite sheet 50 according to Embodiment 1 is increased by about 4% to 12% of 0.025 W/mK.

In the commonly-used fibers, the amount of a solid thermal conduction component is extremely small among three components of thermal conductivity including a solid thermal conduction component, a convection component, and a radiation component. When the total amount of the three components of the thermal conductivity of the fibers is about 0.03 W/mK to 0.08 W/mK, the amount of the solid thermal conduction component is about 0.001 W/mK to 0.003 W/mK.

It is considered that the amounts of the solid thermal conduction component and the radiation component are increased by the addition of the nanofibers 32. However, the radiation component is substantially negligible at a high temperature of 100° C. or higher. Therefore, it can be considered that only the amount of the solid thermal conduction component is increased.

Accordingly, even when the nanofibers 32 are added to the fiber sheet 31, there is an extremely small increase of 0.001 W/mK to 0.003 W/mK in thermal conductivity. On the other hand, the total thermal conductivity of the fiber sheet 31 is not significantly increased, by the addition of the nanofibers 32.

The fiber sheet 31 contains 1 wt % to 10 wt % of the nanofibers 32 with respect to the aerogel 33. A network of the nanofibers 32 having a mesh size smaller than the aerogel 33 having a particle size of about 0.1 μm to 10 μm is formed. Accordingly, the desorption of fine particles of the aerogel 33 is physically suppressed. In addition, by dehydration condensation between hydroxyl groups on the surfaces of the nanofibers 32 and the aerogel 33, the nanofibers 32 and the aerogel 33 can be chemically strongly bonded.

In addition, when the nanofibers 32 are added in an amount of up to 50 wt %, thermal contact resistance is generated between the nanofibers 32 and between the aerogel 33 and the nanofibers 32. Therefore, there is no adverse effect on the heat insulating performance of the composite sheet 50.

Aerogel 33

In addition, the aerogel 33 has an average pore size of 10 nm to 67 nm, a pore volume of 3.5 cc/g to 8 cc/g, and a specific surface area of 500 $m^2$/g to 900 $m^2$/g. The aerogel 33 has pores having a size of less than 68 nm which is the mean free path of air.

The average pore size is preferably 10 nm to 50 nm and more preferably 10 nm to 30 nm. The pore volume is preferably 5 cc/g to 8 cc/g and more preferably 6 cc/g to 8 cc/g. The bulk density is 90 kg/$m^3$ to 250 kg/$m^3$, preferably 120 kg/$m^3$ to 180 kg/$m^3$, and more preferably 140 kg/$m^3$ to 150 kg/$m^3$. In order to secure heat insulating properties, it is necessary that the thermal conductivity be 0.025 W/mK or lower.

When the average pore size, the specific surface area, and the bulk density of the aerogel 33 are in the above-described ranges, heat insulating properties are superior, which is preferable as the composite sheet.

As a starting material for producing the aerogel 33, water glass (aqueous sodium silicate solution) is used. The aerogel 33 can be prepared by adjusting the concentration of silicic acid in water glass, the kind and the concentration, of an acid used during gelation, and gelation conditions (temperature, time, and pH). In addition, hydrophobizing conditions are controlled by adjusting the amount of a silylating agent, the amount of a solvent, temperature, and time. Drying conditions can foe controlled by adjusting drying temperature, time, and the like.

The water glass which is the material of the aerogel 33 only needs to be prepared such that the weight of silica is 5 wt % to 20 wt % with respect to the total weight of sol. The weight of silica, is preferably 10 wt % to 20 wt % and more preferably 15 wt % to 20 wt % with respect to the total weight of sol.

When the concentration of silicic acid is 6 wt % or lower, the concentration of silicic acid is low. Therefore, the strength of a wet gel skeleton may be insufficient. In addition, when the concentration of silicic acid is higher than 20%, the gelation time of a sol solution is rapidly increased, and may become uncontrollable.

Silica aerogel may also be used, as long as it has the same structure as that of the above-described aerogel 33. Silica aerogel dried under normal pressure is preferably used, but silica aerogel subjected to supercritical drying may also be used.

Method of Forming Heat Insulating Layer 13

A method of forming the heat insulating layer 13 will be described. The method includes the following processes. In a sol preparation process, sodium, is removed from the water glass which is the raw material of the aerogel 33, followed by gelation and pH adjustment. In an impregnation process, the sol is impregnated into the nanofibers 32 and the fiber sheet 31 as the substrate before the gelation. In a curing process, a strong skeleton of silica, which can endure a capillary force applied to an inner wall of the gel during solvent drying, is obtained. In a hydrophobizing process, the surface of the aerogel 33 is hydrophobized with silylating agents or functional silanes to prevent dehydration condensation between hydroxyl groups present in the inner wall of the gel during drying and thus to prevent the shrinkage of the gel. In a drying process, a solvent is removed from a fibrous composite sheet.

Here, the functional silanes are a group of silicides consisting of chlorosilane, alkoxysilane, and silazane and are also silylating agents. Particularly in this case, alkoxysilane is preferable in consideration of compatibility with alcohols, ketones, and linear aliphatic hydrocarbons which are solvents. The silylating agents are organic silicon compounds that can substitute active hydrogen in an organic compound with a Si atom.

Sol Preparation Process

An aqueous water glass solution used in Embodiment 1 only needs to be prepared such that the concentration of silicic acid is 5 wt % to 20 wt %. The concentration of silicic acid is preferably 10 wt % to 20 wt % and more preferably 15 wt % to 20 wt %. When the concentration of silicic acid in the aqueous solution is 5 wt % or lower, the concentration of silicic acid is low. Therefore, the strength of a wet gel skeleton may be insufficient. In addition, when the concentration of silicic acid is higher than 20%, the gelation time of a sol solution is rapidly increased and may become out of control.

The water glass is used after removing sodium from the water glass during the preparation of the aerogel 33. As the water glass to be used, any of water glass No. 1 (silica concentration: 35 wt % to 38 wt %), water glass No. 2 (silica concentration: 34 wt % to 36 wt %), and water glass No. 3 (silica concentration: 28 wt % to 30 wt %) which are defined by the Japanese Industrial Standards (JIS K1408) may be used. However, in order to uniformly and densely form a three-dimensional network of silica, water glass No. 1 having a high silica concentration is preferably used.

In order to remove sodium from the aqueous water glass solution, an acidic ion exchanger is used. This water glass is mixed with a proton type ion exchange resin, followed by stirring until the pH of the aqueous water glass solution is 1 to 3 to remove sodium therefrom. Next, a base is added to adjust the pH to a range of 5 to 8 in which gelation is possible. Typical examples of the base include ammonia, ammonium hydroxide, sodium hydroxide, and aluminum hydroxide. Among these, ammonia is preferable from the viewpoint of ease of the pH adjustment.

Alternatively, sol may be prepared by producing a sodium salt using an acid and washing the obtained, hydrogel to remove the sodium salt. At this time, 10 wt % to 30 wt % of the acid is added with respect to the weight of the water glass, and the gel is washed until an electrolyte is removed after curing.

Examples of the acid used, at this time include inorganic acids such as hydrochloric acid, nitric acid, sulfuric acid, hydrofluoric acid, sulfurous acid, phosphoric acid, phosphonic acid, hypophosphoric acid, chloric acid, chlorous acid, and hypochlorous acid; acidic phosphates such as acidic aluminum phosphate, acidic magnesium phosphate, and acidic zinc phosphate; and organic acids such as acetic acid, propionic acid, oxalic acid, succinic acid, citric acid, malic acid, and adipic acid. Among these, hydrochloric acid is preferable from the viewpoint of the gel skeleton strength of the obtained, silica, xerogel.

As the solvent used for washing, a water-soluble solvent such as pure water, methanol, ethanol, or propanol may be used.

Alternatively, instead of the water glass containing sodium, a colloidal silica, solution (pH=10 to 11) in which grains are grown may also be used as the starting material, and similarly uniform hydrogel can be prepared by adding the above-described acid to the solution to adjust the pH to a range of 5 to 8 in which gelation is possible. At this time, the added amount of a 12N hydrochloric acid solution as an acid catalyst is, although depending on an adjustment target pH value, preferably 0.5% to 5.0% and more preferably 1% to 2.5% with respect to 100% of the weight of hydrogel.

Impregnation Process

Next, the nanofibers 32 are added, to the prepared sol in an amount of 1 wt % to 50 wt % with respect to the weight of the sol, followed by dispersing with a stirrer. In a case where the nanofibers 32 has a large specific gravity, it is preferable that the nanofibers 32 be added immediately before gelation because the nanofibers 32 may be precipitated to the bottom when held in the sol for a long period of time after stirring.

As the nanofibers 32 to be used, silica nanofibers 32 or cellulose nanofibers 32 having a fiber diameter of 50 nm or less in which hydroxyl groups are present are used. In addition, both fibers may also be added.

Next, in order to impregnate the sol into the fiber sheet 31 in which the nanofibers 32 are dispersed, the fiber sheet 31 is dipped in the sol containing 50 vol % to 95 vol % of the nanofibers 32 with respect to an air layer of the fiber, thereby obtaining a composite material.

As the fiber sheet 31 to be used, a sheet having a fiber diameter of 1 μm to 50 μm in which a ratio of air in a unit volume is 80% to 99% and more preferably 90% to 99% is used.

The form of the fiber sheet 31 only needs to be for example, glass wool or rock wool, resin fibers such as polyester, or composite fibers containing plural kinds of the above-described materials. These materials are selected in consideration of the heat-resistant temperature and incombustibility during use in addition, since cellulose and pulp fibers are degraded in a process in which an acid, is used during hydrophobizing, it is necessary that the fibers be hydrophobized with alkoxysilane or hexamethyldisilazane.

Curing Process

After the sol containing the nanofibers 32 is impregnated into the fiber sheet 31, it is necessary that the polycondensation of silica colloid in the sol and the growth of secondary particles be accelerated to obtain a strength that endures a capillary force applied during drying. After the gelation of the sol impregnated into the fiber sheet 31, the gel is heated to be cured at a temperature of 70° C. to 95° C., preferably 80° C. to 95° C., and more preferably 90° C. to 95° C. at which water in the sheet is not volatilized, thereby accelerating the polycondensation of silica colloid and the growth of secondary particles.

The curing time needs to be 2 hours to 24 hours, preferably 6 hours to 24 hours, and more preferably 12 hours to 24 hours. Alternatively, the curing time can be reduced by curing the gel in a high-temperature and high-pressure environment.

Hydrophobizing Process

The silylating agent used when the silica nanofibers 32 are added is a silane represented by the formula $R1R2_2SiCl$ or $R1_nSi(OR_2)_{4-n}$ (alkoxysilane wherein R1 and R2 each independently represent C1 to C6 linear alkyl, cyclic alkyl, or phenyl). Hexamethyldisiloxane (HMDSO) or hexamethyldisilazane (HMDS) may also be used.

Here, the silylating agent substitutes active hydrogen such as a hydroxyl group, an amino group, a carboxyl group, an amide group or a mercapto group in an organic compound with silicon.

On the other hand, when the cellulose nanofibers 32 are used and when hydrochloric acid is produced in a hydrophobizing solution, cellulose is degraded. Therefore, the fibers are hydrophobized using $R1_nSi(OR_2)_{4-n}$ (wherein R1 and R2 each independently represent C1 to C6 linear alkyl, cyclic alkyl, or phenyl) or hexamethyldisilazane (HMDS).

As $R1R2_2SiCl$, trimethylchlorosilane (TMCS) is preferable, and as $R1_nSi(OR_2)_{4-n}$, trimethylmethoxysilane is preferable.

When HMDSO is used, TMCS which is an active species may be produced in the reaction system by mixing HCl with HMDSO such that the amount of HCL is 0.02 to 2.0 by molar ratio with respect to the charge amount of HMDSO. In this case, the concentration of the aqueous hydrochloric acid solution is preferably 1N to 12N and more preferably 10N to 12N.

The charge amount of the silylating agent is preferably 100% to 800% and more preferably 100% to 300% with respect to the pore volume of the hydrogel.

Optionally, a hydrophobising reaction is performed in a solvent. At this time, typically, the reaction temperature is 2.0° C. to 100° C. and preferably 30° C. to 60° C. When the reaction temperature is lower than 20° C., the diffusion of the silylating agent is insufficient, which may lead to insufficient hydrophobizing.

Preferable examples of the solvent to be used include alcohols such, as methanol, ethanol, and 2-propanol; ketones such, as acetone and methyl ethyl ketone; and linear aliphatic hydrocarbons such as pentane, hexane, and heptane. The non-hydrophobized gel is hydrophilic, whereas the silylating agent is a hydrophobic solvent. Therefore, in order to efficiently allow the silylating agent of the active species to react with the hydrogel, alcohols or ketones which are amphiphilic solvents are preferably used.

In addition, the hydrophobizing time is preferably 2 hours to 24 hours and more preferably 2 hours to 12 hours.

Drying Process

Next, in order to volatilize the solvent contained in the impregnated sheet after hydrophobizing, the sheet is dried at 100° C. to 150° C. for 2 hours to 5 hours. At this time, in the fiber sheet 31 of the substrate, when the heat-resistant temperature of the resin is the drying temperature or lower, it is preferable that a solvent, for example, alcohols such as methanol, ethanol, and 2-propanol, ketones such as acetone and methyl ethyl ketone, pentane, or hexane be substituted with a solvent having a melting point of the heat-resistant temperature or lower of the resin fiber to dry the fiber sheet 31.

In the composite sheet 50 obtained through the above-described respective processes, unlike a composite sheet of the related art, the network of the nanofibers 32 having a mesh size of less than, a particle size of fine particles of the aerogel 33 is formed, and an effect of dehydration condensation between the aerogel 33 and the nanofibers 32 is obtained. As a result, the desorption of the fine particles is suppressed. When the composite sheet 50 is arbitrarily cut to be used, the desorption of the fine particles of the aerogel 33 from a cross-surface thereof can be suppressed. With this structure, the composite sheet 50 can semipermanently maintain its heat insulating performance.

In addition, in the above-described configuration, the nanofibers 32 and the fiber sheet 31 are used. However, the other substrates may be used, and either the nanofibers 32 or the fiber sheet 31 may be used.

Adhesive Layer 15

A case in which the above-described graphite sheet or a graphite-containing rubber sheet is used as the thermally conductive layer 12 and the aerogel 33 is used as the heat insulating layer 13 is assumed.

Water-Based Adhesive

As the adhesive layer 15, a water-based adhesive is preferably used. For example, an adhesive containing water as a dispersant, an adhesive containing water as a solvent, or an adhesive containing water is preferably used.

The reason is as follows. Since the aerogel 33 as the heat insulating layer 13 is water-repellent and repels the water-based adhesive, the adhesive does not enter the aerogel 33. If the adhesive enters the aerogel 33, the heat insulating performance is decreased. The graphite as the thermally conductive layer 12 is also water-repellent, and the same shall be applied thereto. Water glass or the like may also be used.

The graphite sheet and the aerogel 33 are water-repellent. Therefore, water glass (aqueous solution having a high concentration of sodium silicate) whose viscosity is increased to some extent is allowed to be positioned between the heat insulating layer 13 (aerogel 33) and the thermally conductive layer 12 (graphite) and is heated to 100° C. or higher to vaporize water. As a result, the water glass as the adhesive layer 15 foams and is solidified into an inorganic layer containing silica as a major component. Accordingly, a foam layer can be formed without entering pores of the aerogel 33, and the graphite sheet and the aerogel 33 can be bonded.

One example will be described. In order to prepare a paste of the water glass for forming the adhesive layer 15, silica particles (spherical particles having an average particle size of 2 μm), sodium silicate (solution in which a molar ratio $(SiO_2/Na_2O)$ of silicon dioxide to sodium oxide is approximately 2.5), and potassium silicate (solution in which a molar ratio $(SiO_2/K_2O)$ of silicon dioxide to potassium oxide is approximately 2) are mixed with each other.

The molar ratio $(SiO_2/Na_2O)$ of silicon dioxide to sodium oxide in sodium silicate is preferably about 2 to 4 and more preferably about 2.5 because the molar ratio affects coating properties. In addition, the molar ratio $(SiO_2/K_2O)$ of silicon dioxide to potassium oxide in potassium silicate is preferably about 1 to 4 and more preferably about 2 because the molar ratio affects coating properties and water resistance as in the molar ratio of $(SiO_2/Na_2O)$.

During the adjustment of the paste, the mixture is stirred twice with a rotating and revolving vacuum mixer at 1500 rpm for 3 minutes.

In particular, as the heat insulating layer 13, water glass formed of the same silicic acid-based material as that of the aerogel 33 is preferably used because it has high adhesion and does not decrease the heat insulating properties of the aerogel 33.

Foam-Based Adhesive

Further, as the adhesive, an adhesive in which gaps 20 (FIG. 1B) are formed in the end is preferably used. For example, an adhesive which foams is preferably used. By allowing the gaps 20 to be formed, heat conduction from the thermally conductive layer 12 to the heat insulating layer 13 is inhibited. In addition, the gaps 20 flexibly work on changes in the distance between the component 11 and the housing 14. Therefore, the composite sheet can follow the changes in the distance between the component 11 and the housing 14, and a heat insulating structure which is stable for a long period of time can be obtained.

Further, the gaps 20 on the surface of the adhesive layer 15 function as spaces where air in the heat insulating layer 13 can be evacuated. In addition, it is necessary that the gaps 20 not penetrate the adhesive layer 15. The reason is that heat is conducted between the heat insulating layer 13 and the thermally conductive layer 12 through air of a penetrating portion. It is preferable that the gaps 20 be closed spaces where the incoming and outgoing of air is prohibited. In this case, the gaps 20 on the surface of the adhesive layer 15 are not necessarily closed. It is preferable that the gaps 20 be uniformly distributed in the adhesive layer 15; and that the size of the gaps 20 be at least one quarter or less of the thickness of the adhesive layer 15. The gaps 20 are not connected to each other, and through holes are not formed. Heat is not transferred. It is more preferable that the size of the gaps 20 be one eighth or less of the thickness of the adhesive layer 15. Accordingly, the formation of large gaps 20 caused by the gaps 20 being bonded to each other can be inhibited, and heat conduction caused by large gaps 20 can be inhibited.

In addition, as the adhesive layer 15, a water-based adhesive in which a resin elastomer is dispersed may be used instead of the water glass such that water is allowed to foam, by heating.

Further, in order to provide the gaps 20, the adhesive layer 15 in which moisture is absorbed on an adhesive may also be used. For example, an acrylic adhesive material into which water is absorbed is inserted, into the graphite and the aerogel. 33 and is heated to 100° C. or higher and pressurized. As a result, water is vaporized in the adhesive layer to foam, and thus the adhesive layer 15 in which air bubbles are formed can be formed.

Composition

In a first process, the water glass as the adhesive layer 15 is coated on the graphite as the thermally conductive layer 12. In a second process, the water glass is heated at a temperature of 80° C. not to foam and to be thickened. In a third process, the thermally conductive layer 12 and the heat insulating layer 13 are bonded to each other through the adhesive layer 15. In a fourth process, the water glass is heated to 100° C. or higher to foam, and be cured to prepare the composite sheet 50.

With this method, the composite sheet 50 in which the heat insulating layer 13 and the thermally conductive layer 12 are bonded to each other through the adhesive layer 15 can be prepared. This composite sheet 50 is interposed between the component 11 and the housing 14 to be used.

Evaluation

Figure 1D:
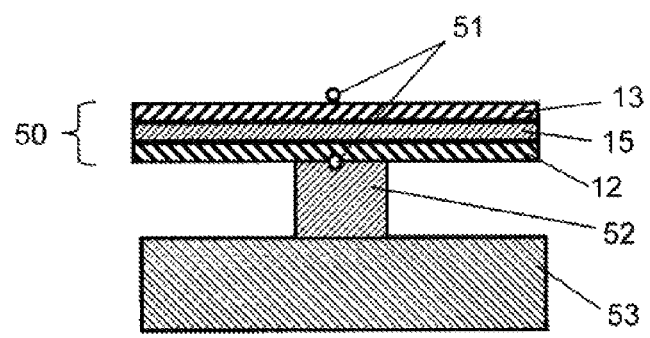
FIG. 1D is a diagram illustrating an evaluation method.

A configuration of FIG. 1D is evaluated. A metal block 52 is provided on a hot plate 53, and the composite sheet 50 is provided thereon. The temperature of a top surface of the composite sheet 50 and the temperature of a portion immediately above the metal block 52 are measured using thermocouples 51. In addition, the temperature of an interface between the surface positioned immediately above the metal block 52 and the thermally conductive layer 12 is measured using the thermocouple 51. The metal block 52 is used as the component 11, and heat is applied thereto from the hot plate 53.

As the heat insulating layer 13, the above-described aerogel 33 having a thickness of 1 mm is used. As the adhesive layer 15, both an epoxy resin and water glass having a thickness of 30 μm is used. As the thermally conductive layer 12, the above-described graphite sheet having a thickness of 0.1 mm is used. The thickness of the aerogel 33 is preferably 5 times to 20 times and more preferably 7 times to 15 times that of the graphite sheet which is the thermally conductive layer 12. With this thickness ratio, heat can be efficiently diffused and insulated, in a limited space.

The area of the composite sheet 50 is 50 mm×80 mm which is the same as those of the heat insulating layer 13, the adhesive layer 15, and the thermally conductive layer 12.

Two samples in which only the adhesive layer 15 is changed and the other conditions are the same are evaluated. The results are shown in Table 1. It can be seen that, when the water glass (Example) is used as the adhesive layer 15, heat is not conducted to the composite sheet 50 as compared to a case where the epoxy resin (Comparative Example) is used as the adhesive layer 15. A difference in temperature between the samples of Example and Comparative Example is only about 2° C. However, when the housing 14 is touched by a hand for a long period of time, this difference is large.

This difference is caused for the following reasons. The epoxy resin infiltrates into the aerogel 33 and the heat insulating performance of the aerogel 33 is decreased. On the other hand, the water glass does not infiltrate into the aerogel 33 and the heat insulating performance of the aerogel 33 is not decreased.

TABLE 1

|  | Adhesive layer 15 | |
|---|---|---|
|  | Example the water glass | Comparative Example the epoxy resin |
| Upper temperature on the composite sheet 50 (° C.) | 46.4 | 49 |
| Upper temperature on the metal block 52 (° C.) | 57.5 | 58 |

Embodiment 2

Figure 2A:
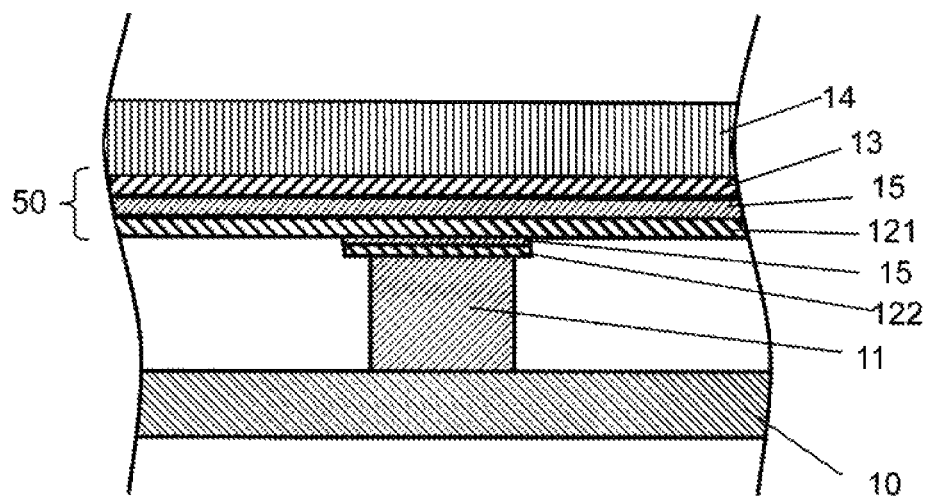
FIGS. 2A and 2B are cross-sectional views illustrating a heat insulating structure according to Embodiment 2.
Figure 2B:
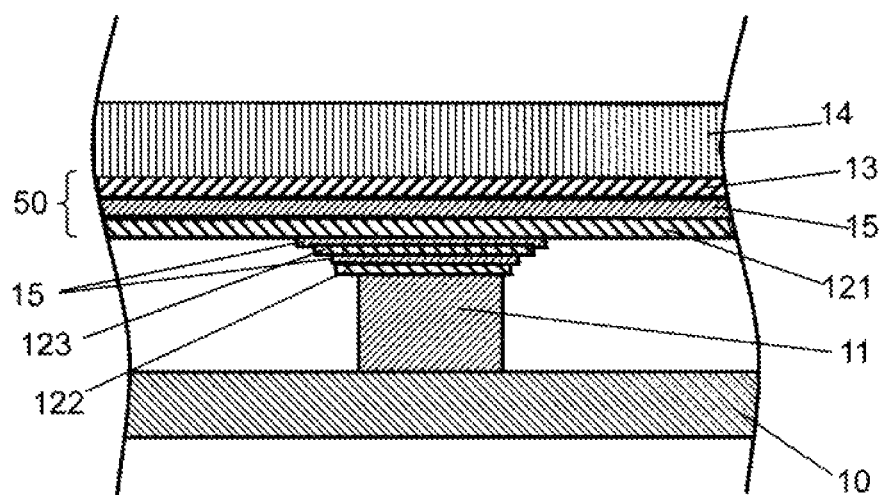

FIGS. 2A and 2B illustrate Embodiment 2. FIGS. 2A and, 2B are drawings corresponding to FIG. 1A and cross-sectional views of a heat insulating structure. Embodiment 2 has a different point from. Embodiment 1 in the structure of the thermally conductive layer 12, The other points are the same as those of Embodiment 1.

In FIG. 2A, as the thermally conductive layer, two layers including a first thermally conductive layer 121 and a second thermally conductive layer 122 are laminated. These two layers are bonded through the adhesive layer 15. The first thermally conductive layer 121 has an area in a sufficient range (four times or more a top surface of the component), and the second thermally conductive layer 122 has a larger area than that of the top surface of the component (two times or less the top surface of the component). Heat on the top portion of the component 11 has the highest temperature and is most non-uniform. At this top portion, one more thermally conductive layer 12 is disposed. As a result, the heat can be efficiently diffused, and the heat insulating performance is higher than Embodiment 1.

In FIG. 2B, a third thermally conductive layer 123 is laminated over the component 11 between the first thermally conductive layer 121 and the second thermally conductive layer 122 through adhesive layers 15. The areas of the respective thermally conductive layers increase toward the top portion. As a result, heat i s easily diffused, and the heat insulating performance is further improved.

The multiple adhesive layers 15 are provided and may be formed of different adhesives. It is preferable that the first thermally conductive layer 121, the second thermally conductive layer 122, the third thermally conductive layer 123, the adhesive layers 15, and the heat insulating layer 13 be formed of the same materials as those of Embodiment 1, respectively.

Embodiment 3

Figure 3:
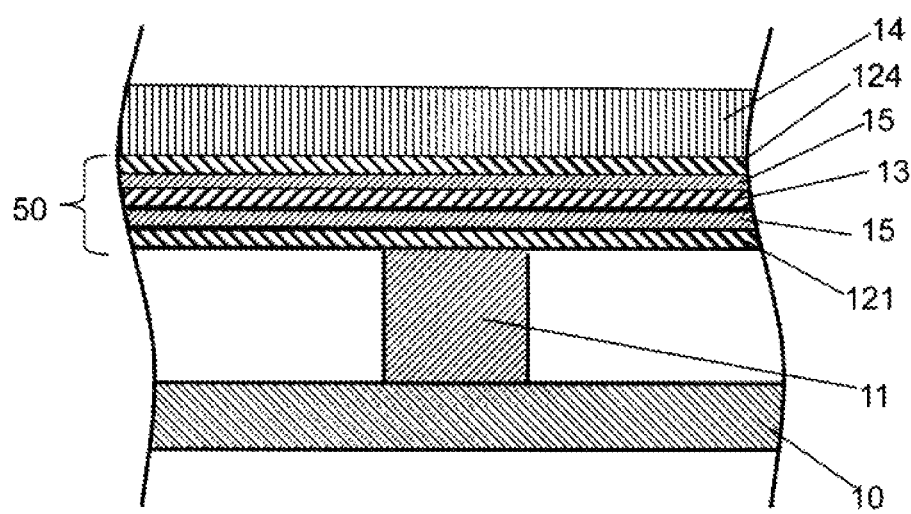
FIG. 3 is a cross-sectional view illustrating a heat insulating structure according to Embodiment 3.

FIG. 3 illustrates Embodiment 3. FIG. 3 is a drawing corresponding to FIG. 1A and a cross-sectional view of a heat insulating structure. Embodiment 3 has a different point from Embodiment 1 in a structure in which the first thermally conductive layer 121 and a fourth thermally conductive layer 124 are laminated.

In FIG. 3, the first thermally conductive layer 121 and the fourth thermally conductive layer 124 are provided above and below the heat insulating layer 13 through the adhesive layers 15. With these three layers, heat can be diffused and insulated, and the heat insulating performance is improved. However, in order to reduce the thickness of the layers, each layer may be formed to be thin. Even if the thickness of the layers is the same as that of FIG. 1A, the heat insulating performance is higher than that of FIG. 1A.

The area of each of the three layers is sufficiently larger than, that of the component 11. For example, the area of each layer is 4 times or more than of that the component 11.

The multiple adhesive layers 15 are provided and may be formed of different adhesives. It is preferable that the first thermally conductive layer 121, the fourth thermally conductive layer 124, the adhesive layers 15, and the heat insulating layer 13 be formed of the same materials as those of Embodiment 1, respectively.

Embodiment 4

Figure 4A:
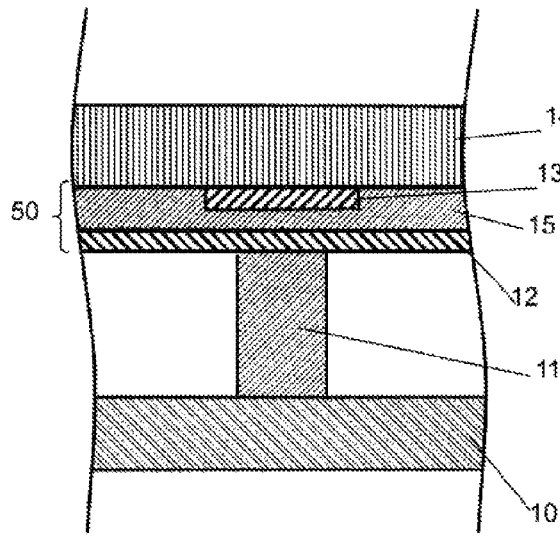
FIGS. 4A to 4D are cross-sectional views illustrating a heat insulating structure according to Embodiment 4.
Figure 4B:
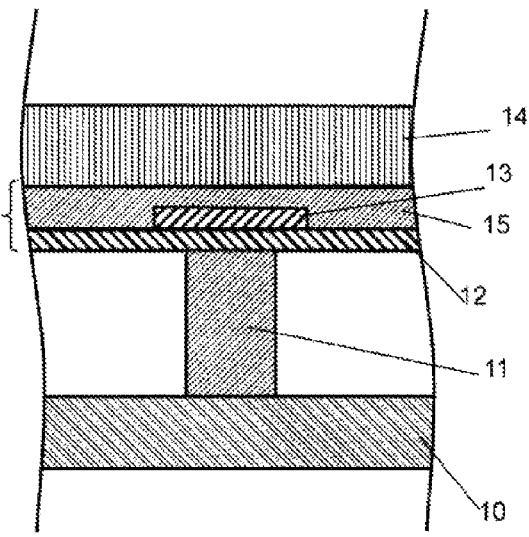
Figure 4C:
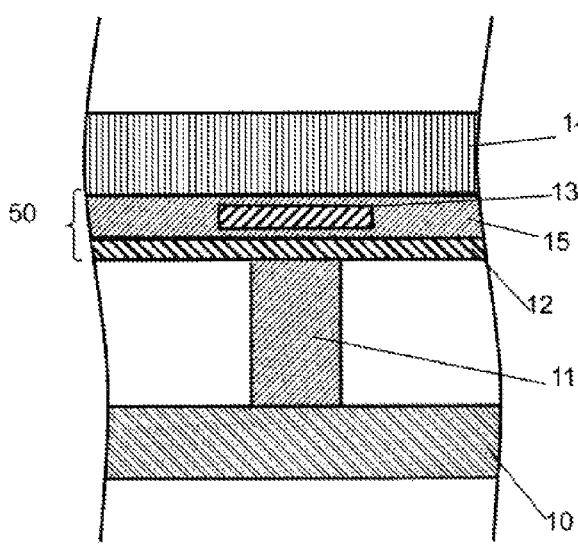

FIGS. 4A to 4C illustrate Embodiment 4. FIGS. 4A to 4C are drawings corresponding to FIG. 1A and cross-sectional views of a heat insulating structure. Embodiment 4 has a different point from Embodiment 1 in that the heat insulating layer 13 is not provided to all the surfaces. Therefore, at least side surfaces of the heat insulating layer 13 are covered with the adhesive layer 15.

In FIG. 4A, the heat insulating layer 13 is positioned in an upper portion of the inside of the adhesive layer 15. The top surfaces of the heat insulating layer 13 and the adhesive layer 15 are positioned on the same side.

With this structure, the heat insulating layer 13 is protected by the adhesive layer 15, and a short distance of heat conduction from the component 11 to the housing 14 can be prevented. In addition, the heat insulating layer 13 is not adhesive, has poor adhesion with the housing 14, and does not conduct a larger amount of heat to the housing 14.

Since the top surfaces of the heat insulating layer 13 and the adhesive layer 15 are positioned on the same side, the composite sheet 50 having a single sheet shape is easily inserted into an electronic apparatus or the like. The same shall be applied to FIGS. 4A to 5B.

In FIG. 4B, the heat insulating layer 13 is positioned in a lower portion of the inside of the adhesive layer 15. The bottom surfaces of the heat insulating layer 13 and the adhesive layer 15 are positioned on the same side.

With this structure, the heat insulating layer 13 is protected by the adhesive layer 15, and a short distance of heat conduction from, the component 11 to the housing 14 can be prevented. The heat insulating layer 13 is protected by being surrounded by the adhesive layer 15 and the thermally conductive layer 12.

Figure 4D:
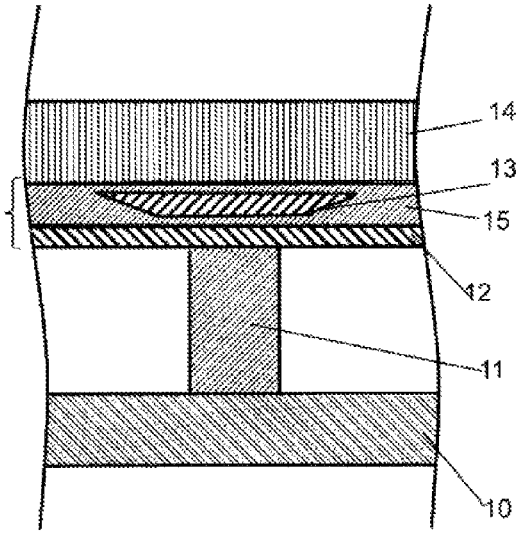

In FIGS. 4C and 4D, the heat insulating layer 13 is positioned in a mid portion of the inside of the adhesive layer 15. The heat insulating layer 13 does not appear on the top and bottom surfaces of the adhesive layer 15.

Owing to this structure, the heat insulating layer 13 is completely covered with the adhesive layer 15 and is protected. Further, in FIG. 4D, owing to this structure, heat conduction to the housing 14 through the adhesive layer 15 is inhibited by the side surfaces of the heat insulating layer 13.

Heat of the component 11 is diffused in the horizontal direction by the thermally conductive layer 12. In this example, heat conduction from only the top portion of the component 11 in which the amount of heat is largest is inhibited. Heat from the other portions is insulated by the adhesive layer 15.

In particular, when the heat insulating layer 13 is the above-described aerogel, the formation of powder or the like can be prevented. The destruction of the heat insulating layer is prevented. Further, the heat insulating layer 13 has a smaller area than that of the thermally conductive layer 12, and the consumption amount thereof can be suppressed.

It is preferable that the thermally conductive layer 12, the adhesive layers 15, and the heat insulating layer 13 be formed of the same materials as those of Embodiment 1, respectively.

Embodiment 5

Figure 5A:
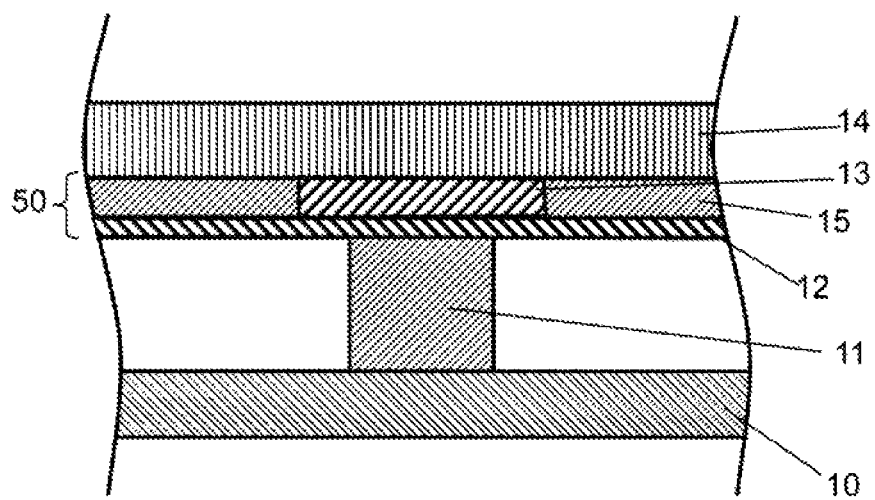
FIGS. 5A and 5B are cross-sectional views illustrating a heat insulating structure according to Embodiment 5.
Figure 5B:
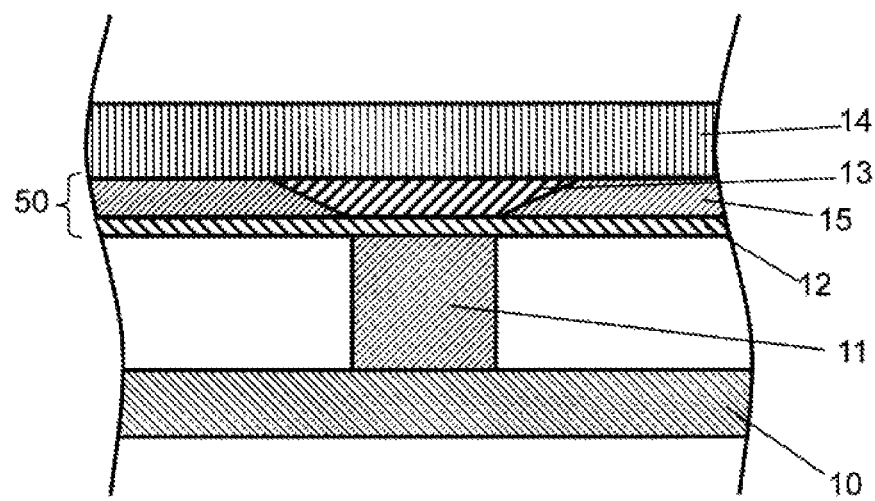
Figure 6:
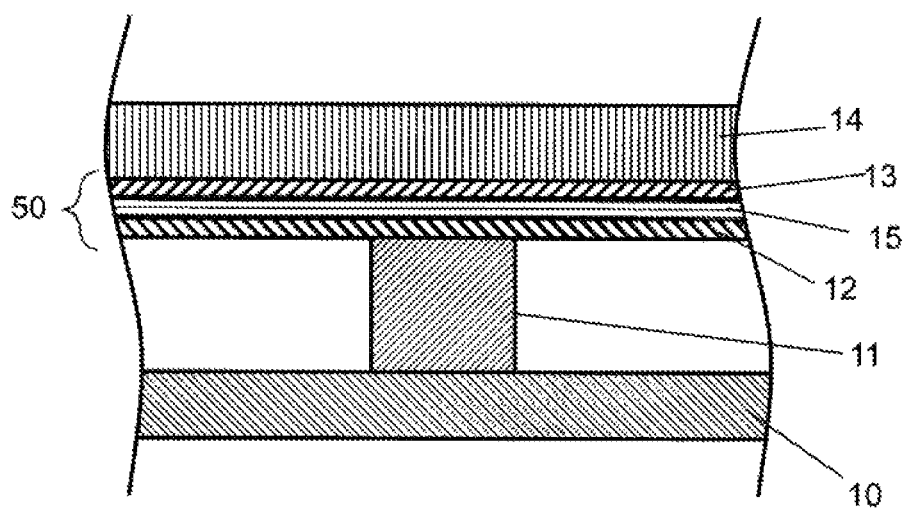
FIG. 6 is a cross-sectional view illustrating a heat insulating structure of the related art.

FIGS. 5A and 5B illustrate Embodiment 5. FIGS. 5A and 5B are drawings corresponding to FIG. 1A and cross-sectional views of a heat insulating structure. Embodiment 5 has a different point from Embodiment 1 in that the heat insulating layer 13 is not provided to all the surfaces. Therefore, at least side surfaces of the heat insulating layer 13 are covered with the adhesive layer 15.

In FIGS. 5A and 5B, the heat insulating layer 13 penetrates the adhesive layer 15. The heat insulating layer 13 appears on the top and bottom surfaces of the adhesive layer 15. The top and bottom surfaces of the heat insulating layer 13 and, the adhesive layer 15 are positioned on the same side.

With this structure, the probability of heat conduction from the component 11 to the housing 14 through the adhesive layer 15 is reduced. As a result, heat of the component 11 is not conducted to the housing 14.

In FIG. 5B, the shape of the heat insulating layer 13 is different from that of FIG. 5A. The size of the heat insulating layer 13 increases toward the housing 14 side and decreases toward the component 11 side.

Owing to this structure, heat conduction to the housing 14 through the adhesive layer 15 is inhibited by the side surfaces of the heat insulating layer 13.

Heat of the component 11 is diffused in the horizontal direction by the thermally conductive layer 12. In this example/heat conduction from only the top portion of the component 11 in which the amount of heat is largest is inhibited. Heat from the other portions is insulated by the adhesive layer 15.

For example, when the heat insulating layer 13 is expensive, when powder or the like is likely to be formed, and when the strength is weak, this structure is desirable. That is, the heat insulating layer 13 is protected by the adhesive layer 15.

It is preferable that the thermally conductive layer 12, the adhesive layers 15, and the heat insulating layer 13 be formed of the same materials as those of Embodiment 1, respectively.

The above-described embodiments can be combined with each other as necessary.

As described above, with the composite sheet according to the invention, a heat insulating effect can be sufficiently exhibited even in a narrow space inside a housing of an electronic apparatus. In addition, with the composite sheet according to the invention, heat conduction from a heat-generating component to an outside surface of a housing can be efficiently reduced.

What is claimed is:

1. A composite sheet comprising:
a graphite sheet comprising substantially only graphite;
a silica aerogel layer; and
an adhesive layer fixed to the graphite sheet and the silica aerogel layer between the graphite sheet and the silica aerogel layer,
wherein the adhesive layer is one of an adhesive containing water as a dispersant, an adhesive containing water as a solvent, and an adhesive containing water,
wherein the silica aerogel layer contains a resin fiber sheet and an aerogel, and the adhesive does not enter the aerogel.

2. The composite sheet according to Claim 1, wherein the resin fiber sheet contains nanofibers.

3. The composite sheet according to claim 2, wherein a diameter of the nanofibers is 30 nm or less.

4. The composite sheet according to claim 1, wherein a plurality of graphite sheets are laminated to the adhesive layer.

5. The composite sheet according to claim 1, wherein a plurality of graphite sheets are provided to only a portion of the silica aerogel layer.

6. The composite sheet according to claim 1, wherein an area of the silica aerogel layer is less than an area of the graphite sheet.

7. The composite sheet according to claim 6, wherein side surfaces of the silica aerogel layer are covered with the adhesive layer.

8. The composite sheet according to claim 6, wherein the silica aerogel layer is positioned inside the adhesive layer.

9. The composite sheet according to claim 6, wherein side surfaces of the silica aerogel layer are covered with the adhesive layer,
a top surface of the silica aerogel layer is not covered with the adhesive layer, and
a bottom surface of the silica aerogel layer is covered with the adhesive layer.

10. The composite sheet according to claim 6, wherein side surfaces of the silica aerogel layer are covered with the adhesive layer,
a top surface of the silica aerogel layer is covered with the adhesive layer, and
a bottom surface of the silica aerogel layer is not covered with the adhesive layer.

11. The composite sheet according to claim 6, wherein side surfaces of the silica aerogel layer are covered with the adhesive layer,
a top surface of the silica aerogel layer is not covered with the adhesive layer, and
a bottom surface of the silica aerogel layer is not covered with the adhesive layer.

12. The composite sheet according to claim 6, wherein side surfaces of the silica aerogel layer are covered with the adhesive layer, and
a top surface of the silica aerogel layer has a larger area than that of a bottom surface of the silica aerogel layer.

13. A mounting structure comprising
an electronic component;
a housing; and
the composite sheet according to claim 1, the composite sheet provided between the electronic component and the housing.

14. A mounting structure comprising
an electronic component;
a housing; and
the composite sheet according to claim 6, the composite sheet provided between the electronic component and the housing.

15. An electronic apparatus comprising
a substrate;
an electronic component mounted on the substrate;
a housing; and
the composite sheet according to claim 1, the composite sheet provided between the electronic component and the housing.

16. An electronic apparatus comprising
a substrate;
an electronic component mounted on the substrate;
a housing; and
the composite sheet according to claim 6, the composite sheet provided between the electronic component and the housing.

17. The composite sheet according to claim 1, wherein a thermal conductivity of the graphite sheet in a parallel direction is 1000 W/mk or higher, and the thermal conductivity of the graphite sheet in a perpendicular direction is 5 W/mk or lower.

18. The composite sheet according to claim 6, wherein a thermal conductivity of the graphite sheet in a parallel direction is 1000 W/mk or higher, and the thermal conductivity of the graphite sheet in a perpendicular direction is 5 W/mk or lower.

19. The composite sheet according to claim 1, wherein the silica aerogel layer is water-repellent.

20. The composite sheet according to claim 1, wherein the adhesive layer contains a gap that does not penetrate the adhesive layer and is a closed space.

21. The composite sheet according to claim 1, wherein the adhesive is a foam-based adhesive.

* * * * *